（12） United States Patent
Huang et al.

(10) Patent No.: US 10,867,823 B2
(45) Date of Patent: Dec. 15, 2020

(54) FAULT DETECTION METHOD IN SEMICONDUCTOR FABRICATION

(71) Applicant: Taiwan Semiconductor Manufacturing Co., Ltd., Hsinchu (TW)

(72) Inventors: Chun-Jung Huang, Yunlin County (TW); Yung-Lin Hsu, Hsin-Chu (TW); Kuang-Huan Hsu, Hsinchu (TW); Wei-Chih Chen, Taichung (TW); Jen-Ti Wang, Taichung (TW); Chih-Hung Liu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 147 days.

(21) Appl. No.: 15/991,651

(22) Filed: May 29, 2018

(65) Prior Publication Data
US 2019/0371636 A1 Dec. 5, 2019

(51) Int. Cl.
*H01L 21/67* (2006.01)
*H01L 21/66* (2006.01)
*G05B 19/418* (2006.01)

(52) U.S. Cl.
CPC .. *H01L 21/67276* (2013.01); *G05B 19/41875* (2013.01); *G05B 19/41895* (2013.01); *H01L 21/67288* (2013.01); *H01L 22/34* (2013.01)

(58) Field of Classification Search
CPC ......... H01L 21/67276; H01L 21/67288; H01L 22/34; G05B 19/41895; G05B 19/41875
USPC ...................................................... 324/762.1
See application file for complete search history.

(56) References Cited

U.S. PATENT DOCUMENTS

| 4,514,687 | A | * | 4/1985 | Van Husen | ............ | G01R 35/00 |
| | | | | | | 324/537 |
| 4,613,804 | A | * | 9/1986 | Swenson | ............... | G05D 1/0263 |
| | | | | | | 104/88.03 |
| 4,665,369 | A | * | 5/1987 | Faller | ................... | G05D 1/0055 |
| | | | | | | 324/326 |

(Continued)

FOREIGN PATENT DOCUMENTS

| CN | 1237422 C | 1/2006 |
| CN | 101633463 A | 9/2011 |

(Continued)

OTHER PUBLICATIONS

Chinese language Office Action dated Nov. 19, 2019, issued in application No. TW 108108349.

*Primary Examiner* — Christopher P McAndrew
(74) *Attorney, Agent, or Firm* — McClure, Qualey & Rodack, LLP

(57) ABSTRACT

A fault detection method in a semiconductor fabricating factory is provided. The method includes delivering a test vehicle along a rail to a test region. The method further includes projecting a test signal from a transducer that is positioned on the test vehicle over a check board when the test vehicle is located within the test region. The check board and the test vehicle are arranged along an axis that is parallel to the rail. The method also includes performing an analysis of the test signal projected over the check board. In addition, the method includes issuing a warning alarm when an abnormality is detected based on the analysis result.

20 Claims, 13 Drawing Sheets

(56) References Cited

U.S. PATENT DOCUMENTS

| | | | | |
|---|---|---|---|---|
| 4,716,530 A * | 12/1987 | Ogawa | | G05D 1/0234 180/168 |
| 4,829,445 A * | 5/1989 | Burney | | G05B 19/4183 700/230 |
| 4,908,557 A * | 3/1990 | Sudare | | G05D 1/0261 180/168 |
| 4,990,841 A * | 2/1991 | Elder | | G05D 1/0263 180/168 |
| 4,996,468 A * | 2/1991 | Field | | G01S 17/931 318/587 |
| 5,036,935 A * | 8/1991 | Kohara | | G05D 1/0272 180/168 |
| 5,127,486 A * | 7/1992 | Yardley | | B62D 1/28 180/168 |
| 5,187,664 A * | 2/1993 | Yardley | | G05D 1/0265 180/167 |
| 5,192,903 A * | 3/1993 | Kita | | B61L 23/34 180/167 |
| 5,245,335 A * | 9/1993 | Hill | | G05D 1/0265 180/168 |
| 5,455,768 A * | 10/1995 | Johnson | | G01P 3/66 324/238 |
| 6,081,187 A * | 6/2000 | Akutsu | | G01S 13/878 340/436 |
| 6,127,947 A * | 10/2000 | Uchida | | B60G 17/0195 340/439 |
| 6,292,112 B1 * | 9/2001 | Bader | | B61L 29/284 246/202 |
| 6,732,045 B1 | 5/2004 | Irmer | | |
| 6,847,916 B1 * | 1/2005 | Ying | | G05B 23/0208 702/108 |
| 7,039,495 B1 * | 5/2006 | Conboy | | G05B 19/41865 700/213 |
| 7,123,980 B2 | 10/2006 | Funk et al. | | |
| 7,274,971 B2 * | 9/2007 | Brill | | G05B 19/4189 700/230 |
| 8,862,397 B2 | 10/2014 | Tsujimoto et al. | | |
| 9,651,458 B2 * | 5/2017 | Moore | | G01S 17/931 |
| 2002/0165648 A1 * | 11/2002 | Zeitler | | G05D 1/0265 701/23 |
| 2003/0236587 A1 * | 12/2003 | Ono | | H01L 21/67288 700/112 |
| 2004/0049398 A1 * | 3/2004 | Gartland | | G06Q 10/08 700/110 |
| 2004/0118659 A1 * | 6/2004 | Haris | | G05B 19/41815 198/345.3 |
| 2005/0093504 A1 * | 5/2005 | Jones | | H02P 25/102 318/725 |
| 2007/0150085 A1 * | 6/2007 | Akiyama | | H01L 21/67276 700/112 |
| 2009/0132179 A1 * | 5/2009 | Fu | | G01K 13/06 702/34 |
| 2010/0183409 A1 * | 7/2010 | Checketts | | B62D 5/0418 414/231 |
| 2010/0278622 A1 * | 11/2010 | Huang | | H01L 21/67276 414/673 |
| 2014/0068753 A1 * | 3/2014 | Gonzalez | | G05B 19/4189 726/17 |
| 2016/0266578 A1 * | 9/2016 | Douglas | | G05D 1/0225 |
| 2017/0066459 A1 * | 3/2017 | Singh | | B61L 23/045 |
| 2017/0344009 A1 * | 11/2017 | Wernersbach | | G08G 1/00 |
| 2018/0089616 A1 * | 3/2018 | Jacobus | | G05D 1/0274 |
| 2019/0135549 A1 * | 5/2019 | Kilibarda | | B65G 35/06 |
| 2019/0160493 A1 * | 5/2019 | Garrett | | B07C 5/3416 |
| 2019/0238182 A1 * | 8/2019 | Oh | | H04B 15/005 |

FOREIGN PATENT DOCUMENTS

| | | |
|---|---|---|
| CN | 103373592 A | 10/2013 |
| TW | 200415453 A | 8/2004 |
| TW | M310155 U | 4/2007 |
| TW | M356218 U | 5/2009 |

* cited by examiner

FAULT DETECTION METHOD IN SEMICONDUCTOR FABRICATION

BACKGROUND

Automated material handling systems (AMHS) are widely used in semiconductor fabrication facilities (FABs) to automatically handle and transport groups or lots of wafers between various processing machines (i.e. semiconductor tools) used in chip fabrication. The AMHS is computer controlled for handling the staging of wafers for processing and the flow of wafer traffic in the FAB. In addition, an AMHS may also be used to automatically handle and transport photomask reticles between various semiconductor tools during the fabrication process.

The AMHS typically includes numerous types of automated and manual mechanisms for moving and transporting the carriers for storing wafers or reticles throughout the FAB during the fabrication process. This can include, for example, automatic guided vehicles (AGVs), personal guided vehicles (PGVs), rail guided vehicles (RGVs), overhead shuttles (OHSs), and overhead hoist transports (OHTs).

Among the foregoing transport mechanisms of the AMHS, OHTs are commonly used to transport the article carriers or retile carriers from the load port of one semiconductor tool to the load port of the next semiconductor tool in the processing sequence. An OHT system includes at least one vehicle that travels on an overhead monorail of the AMHS. The vehicle on-board hoist is operable to raise and lower the article carriers or reticle carriers, thereby allowing the vehicle to deposit and retrieve the article carriers or reticle carriers from the load ports of semiconductor tools positioned along and on the floor beneath the overhead rail.

Although existing OHT systems for transporting wafers or reticles in a FAB during the fabrication process have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
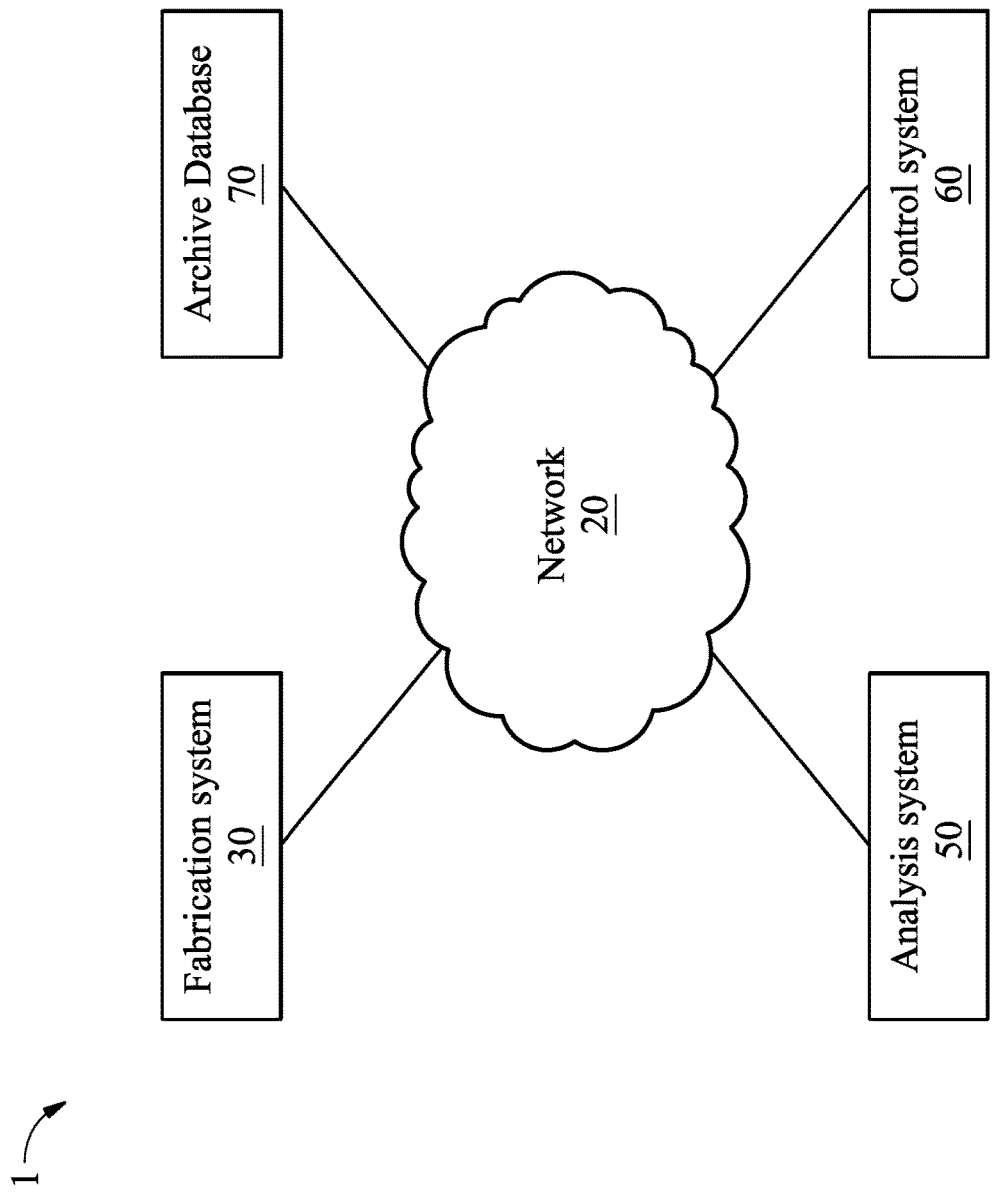
FIG. 1 shows a block diagram of a fabrication facility according to various aspects of the present disclosure.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 is a block diagram of a fabrication facility 1 according to various aspects of the present disclosure. The fabrication facility 1 implements integrated circuit manufacturing processes to fabricate integrated circuit devices. For example, the fabrication facility 1 may implement semiconductor manufacturing processes that fabricate semiconductor wafers. It should be noted that, in FIG. 1, the fabrication facility 1 has been simplified for the sake of clarity to better understand the inventive concepts of the present disclosure. Additional features can be added in the fabrication facility 1, and some of the features described below can be replaced or eliminated in other embodiments of the fabrication facility 1. The fabrication facility 1 may include more than one of each of the entities in the depicted embodiment, and may further include other entities not illustrated in the depicted embodiment.

In some embodiments, the fabrication facility 1 includes a network 20 that enables various entities (a fabrication system 30, an analysis system 50, a control system 60 and an archive database 70) to communicate with one another.

The network 20 may be a single network or a variety of different networks, such as an intranet, the Internet, another network, or a combination thereof. The network 20 may include wired communication channels, wireless communication channels, or a combination thereof.

Figure 2:
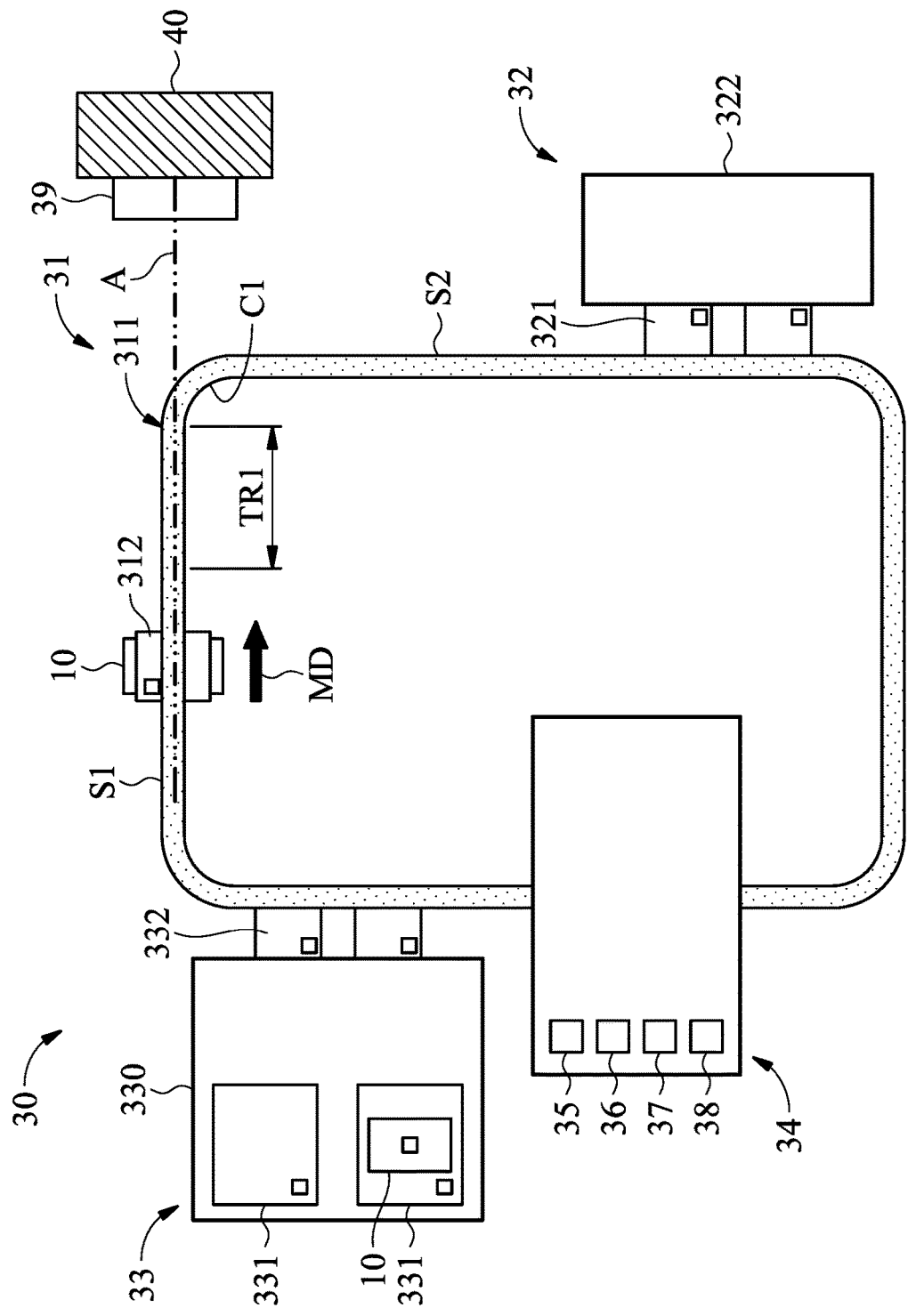
FIG. 2 is a schematic view of a fabrication system, in accordance with some embodiments.

FIG. 2 is a schematic view of the fabrication system 30, in accordance with some embodiments. In some embodiments, the fabrication system 30 includes a transportation apparatus 31, a processing tool 32, a stocker 33, a maintenance station 34, and a check board 39.

The transportation apparatus 31 is configured to transport or convey the article carrier 10 to and from different locations in the fabrication system 30. In some embodiments, the article carrier 10 comprise standard mechanical interface (SMIF) pods which can hold a plurality of wafers (e.g. 200 mm or 8 inch), or front opening unified pods (FOUPs) which can hold larger wafers (e.g. 300 mm (12 inch) or 450 mm (18 inch)). The article carrier 10 can hold approximately 25 wafers, for example. Alternatively or additionally, the article carrier 10 may include other SMIF pods which can hold one or more reticles for a lithography exposure process.

The transportation apparatus 31 includes a rail 311 and a number of vehicles 312 (only one vehicle 312 is shown in FIG. 2), in accordance with some embodiments. The rail 311 is mounted on the ceiling of a FAB, for example. In some embodiments, the rail 311 includes a number of straight paths, such as straight paths S1 and S2, and a curved path C1. The straight paths S1 and S2 are arranged to be perpendicular to each other, and the curved path C1 connects the straight path S1 with the straight path S2. A test region TR1 is located on a portion of the straight path S1 that is adjacent to the curved path C1.

The vehicles 312 are suspended by the rail 311, and the transportation or the movement of the vehicle 312 along the rail 311 is controlled by the control system 60 (FIG. 1). Each of the vehicles 312 may include a gripper (not shown in figures) to grip the article carrier 10, and the gripper is operable to raise and lower the article carrier 10, thereby allowing the article carrier 10 to be removed from load ports 321 and 332 (which will be described later) positioned along and on the floor beneath the rail 311.

In some embodiments, the control system 60 (FIG. 1) controls the vehicle 312 to move along the rail 311 to pass the straight path S1, the curved path C1 and the straight path S2 in order. When the vehicle 312 travels along a straight path S1, the vehicle 312 moves along a moving direction MD that is parallel to the straight path S1. In addition, due to the curvature of the curved path C1, when the vehicle 312 approaches the test region TR1, the speed of the vehicle 312 is slowed down, to reduce wear on the rollers (not shown in figures) of the vehicle 312 and the rail 311.

Figure 3:
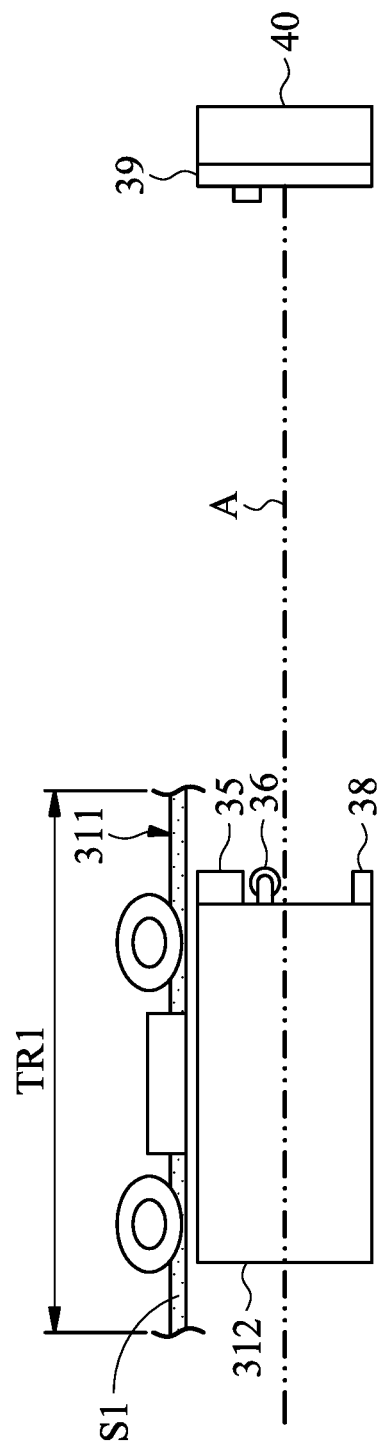
FIG. 3 shows a side view of a vehicle and a check board, in accordance with some embodiments.
Figure 4:
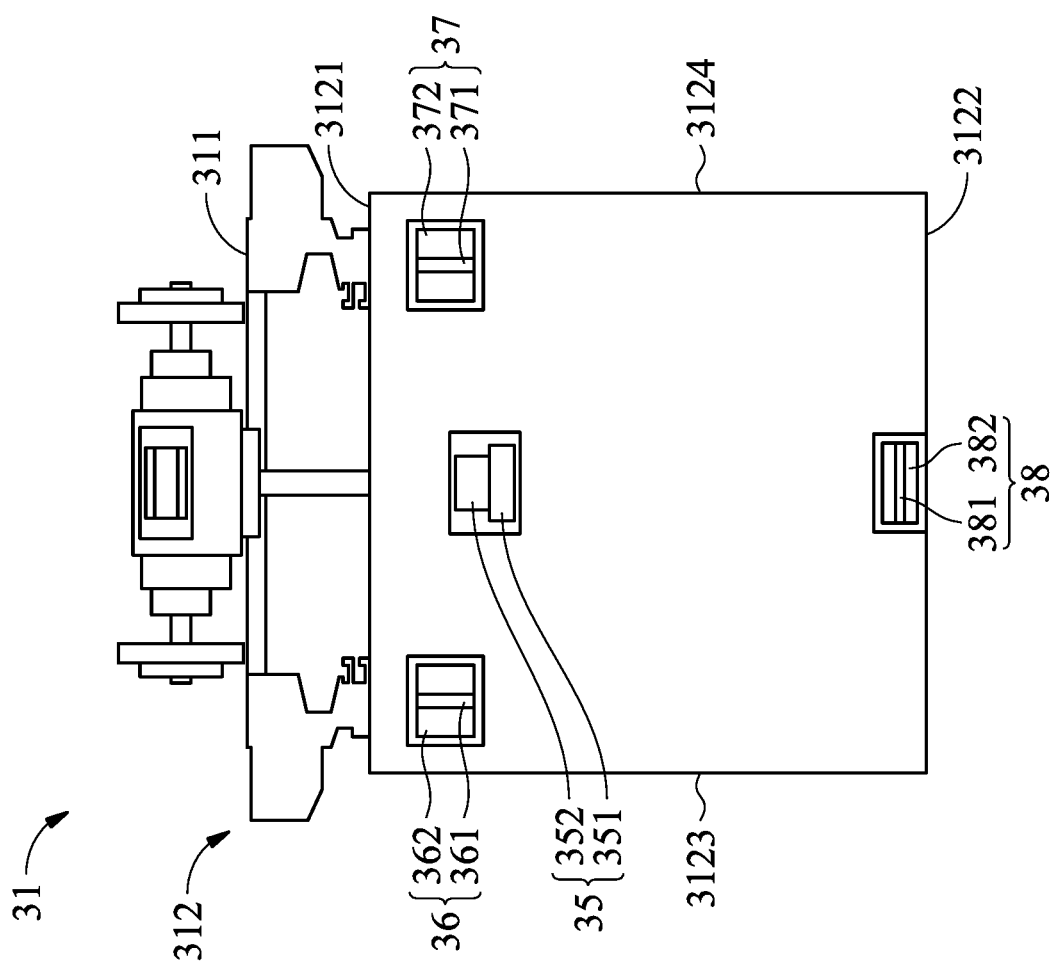
FIG. 4 shows a schematic view of a vehicle as observed along the opposite direction of the moving direction of the vehicle, in accordance with some embodiments.

FIG. 3 shows a side view of the transportation apparatus 31 and the check board 39, and FIG. 4 shows a schematic view of the vehicle 312 as observed along a direction that is opposite to the moving direction MD (FIG. 2) of the vehicle 312. In some embodiments, the transportation apparatus 31 further includes a number of metrology tools, such as metrology tools 35, 36, 37 and 38 (metrology tool 37 and 38 are shown more clearly in FIG. 4). The metrology tools 35, 36, 37 and 38 are configured to monitor the front of the vehicle 312 to determine if the vehicle 312 is getting close to an object, such as another vehicle 312.

In some embodiments, as shown in FIG. 4, the metrology tool 35 is positioned at a central line of the vehicle 312, and is closer to a top edge 3121 of the vehicle 312 than a bottom edge 3122 of the vehicle 312. The metrology tool 35 includes a transducer 351 and a detection sensor 352. The transducer 351 and the detection sensor 352 may be integrated into one single module or be made separately.

In some embodiments, the transducer 351 includes a laser transmitter which emits a test signal ahead of the vehicle 312. The detection sensor 352 receives a reflected test signal from an object and produces a detection signal according to the reflected test signal. The test signal may include a number of lasers beams, such as 12 laser beams, expanded in a fan-shaped manner along a horizontal direction. One example of the transmission of the test signal produced will be clearly described in the description in relation to FIG. 8A. However, it should be appreciated that many variations and modifications can be made to embodiments of the disclosure. The test signal produced by the transducer 351 may include sonar, microwave, and other signals that can be reflected by an object.

As shown in FIG. 4, the metrology tool 36 is positioned adjacent to a left edge 3123 of the vehicle 312, the metrology tool 37 is positioned adjacent to a right edge 3124 of the vehicle 313, and the metrology tool 38 is positioned adjacent to the bottom edge 3122 of the vehicle 312. Each of the metrology tools 36, 37 and 38 includes a transducer 361, 371 and 381 and a detection sensor 362, 372 and 382. The transducers 361, 371 and 381 and the detection sensors 362, 372 and 382 in the corresponding metrology tools 36, 37 and 38 may be integrated into one single module or be made separately.

In some embodiments, each of the transducers 361, 371 and 381 includes an LED (light emitting diode), and each of the detection sensors 362, 372 and 382 includes a photo diode. The transducers 361, 371 and 381 produce test signals ahead of the vehicle 312. Afterwards, the detection sensors 362, 372 and 382 receive reflected test signals from an object located in front of the vehicle 312 and produce detection signals according to the reflected test signal. The transducers 361 and 371 may emit light in fan-shaped manner along a vertical direction, and the transducer 381 may emit light in a fan-shaped manner along a horizontal direction, which will be clearly shown in the description in relation to FIG. 8B.

Referring to FIG. 3, a check board 39 is configured to check the health of the metrology tools 35, 36, 37 and 38 when the vehicle 312 is located in the test region, such as the test region TR1. In some embodiments, the check board 39 is positioned in the axis A that is parallel to the straight path S1 of the rail 311. The check board 39 may be hung on a wall 40 of the FAB. Alternatively, the check board 39 may be hung on a ceiling of the FAB. When the vehicle 312 moves into the test region TR1 along a straight path S1, the test signals produced by the vehicle 312 are projected over the check board 39 and reflected by the check board 39. The detection sensors detect the test signals reflected back from the check board 39 to determine if any abnormality has occurred in the metrology tools 35, 36, 37 and 38.

Figure 5:
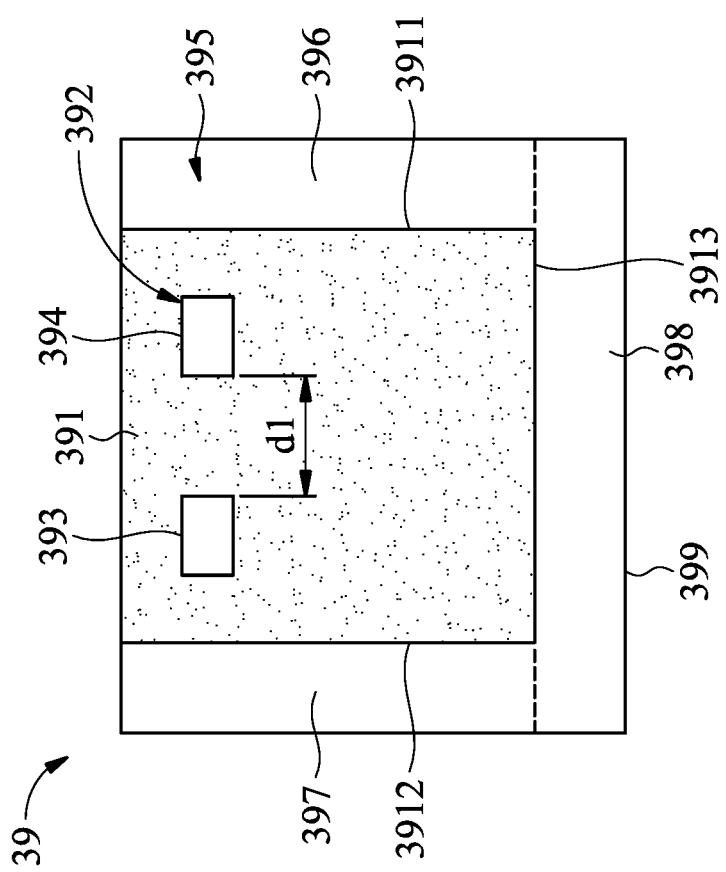
FIG. 5 shows a schematic view of a check board as observed along the moving direction of the vehicle, in accordance with some embodiments.

FIG. 5 shows a schematic view of the check board 39, in accordance with some embodiments. To check the condition of the metrology tools 35-38 shown in FIG. 4, the check board 39 includes one non-reflective region 391 formed on the substantial central area of the check board 39. The non-reflective region 391 may be formed from a plate coated with a dark color or another light-absorbing material that may substantially absorb the light or laser projected thereon.

The check board 39 further includes a reflective region 392 formed in the non-reflective region 391. The reflective region 392 is used to reflect the test signal produced by the transducer 351. The reflective region 392 may include two rectangular sub-regions 393 and 394. The two sub-regions 393 and 394 are separated from each other by a predetermined distance dl and surrounded by the non-reflective region 391. The distance dl may be in a range from about 50 mm to about 150 mm. The two rectangular sub-regions 393 and 394 may each include a pad which is made of light-reflective material, for example, the two rectangular sub-regions 393 and 394 are two small mirrors. The two pads may be protruded from the non-reflective region 391.

The check board 39 also has a reflective region 395. The reflective region 395 is used to reflect the test signals produced by the transducers 361, 371 and 381 (FIG. 4). In some embodiments, the reflective region 395 is arranged corresponding to the light shape of the transducers 361, 371 and 381. For example, corresponding to two vertical lights from the transducer 361 and 371 (FIG. 4), the reflective region 395 includes two longitudinal sub-regions 396 and 397. The two longitudinal sub-regions 396 and 397 are located at two opposite sides of the non-reflective region 391 and connect two outer sides 3911 and 3912 of the non-reflective region 391 to an outer edge 399 of the check board 39.

In addition, corresponding to one horizontal light beam from the transducer 381 (FIG. 4), the reflective region 395 further includes a traversal sub-region 398. The traversal sub-region 398 is located at the bottom side of the non-reflective region 391 and connects the outer side 3913 of the non-reflective region 391 to the outer edge 399 of the check board 39. In the certain embodiment shown in FIG. 5, the reflective region 395 has a U-shape and overlaps with three outer sides 3911, 3912 and 3913 of the non-reflective region 391. The reflective region 395 may be made of light-reflective material, for example, Acrylic.

It should be noted that the number of the metrology tools of the vehicle 312 and the configurations of the check board 39 should not be limited to the embodiments shown in FIGS. 4 and 5. In some other embodiments, the reflective region 392 is omitted when the metrology tool 35 is not used. In some other embodiments, the reflective region 395 includes the sub-regions 396 and 397, and the sub-region 398 is omitted when the metrology tool 38 is not used.

Figure 6:
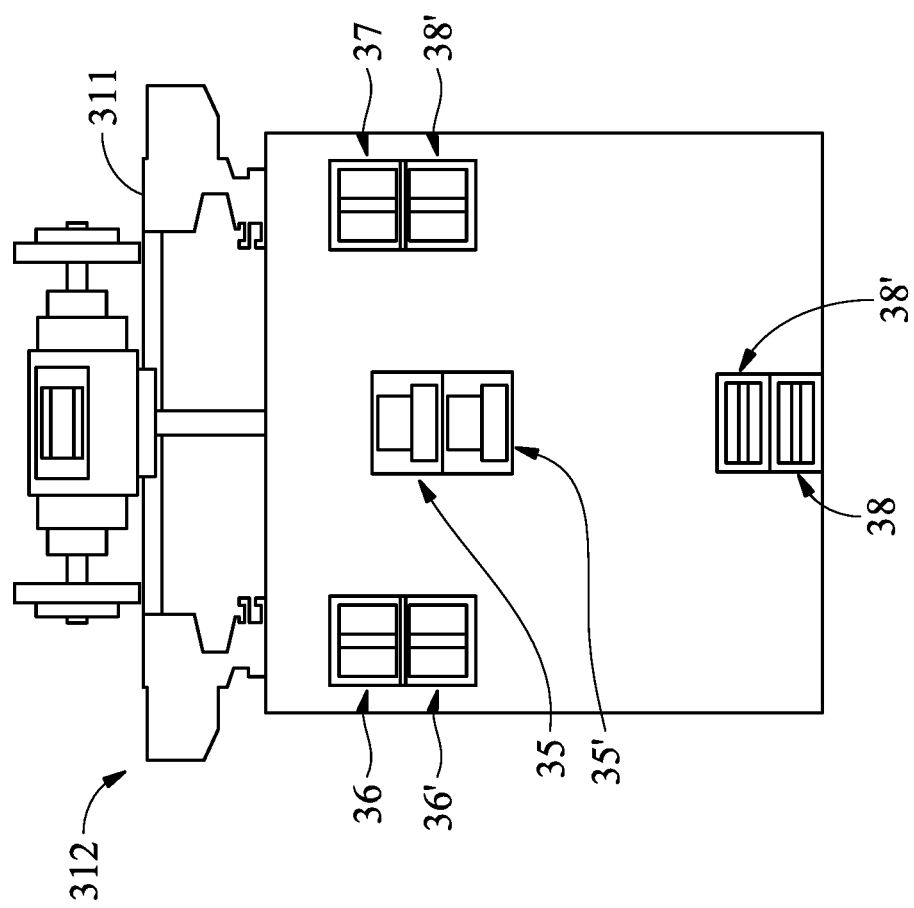
FIG. 6 shows a schematic side view of a vehicle, in accordance with some embodiments.

FIG. 6 shows a side view of the vehicle 312 positioned on the rail 311, in accordance with some embodiments. In some embodiments, a number of backup metrology tools 35', 36', 37' and 38' are positioned on the vehicle 312. The backup metrology tools 35', 36', 37' and 38' are positioned immediately adjacent to the metrology tools 35, 36, 37 and 38. Alternatively, the backup metrology tools 35', 36', 37' and 38' are integrated with the metrology tools 35, 36, 37 and 38 in one module. The backup metrology tools 35', 36', 37' and 38' have the same configuration as the metrology tools 35, 36, 37 and 38 and are activated while the corresponding metrology tools 35, 36, 37 and 38 are detected as being abnormal.

Referring to FIG. 2, the processing tool 32 is configured to perform a wafer fabrication process. The processing tool 32 may include any type of wafer processing tools used in semiconductor chip fabrication. In some embodiments, the processing tool 32 is a deposition tool for forming a material layer over a wafer (not shown in FIG. 2). Alternatively, the processing tool 32 is a lithography tool for performing a lithography process over the material layer formed on the wafer. Alternatively, the processing tool 32 may include tools for metrology, inspection, testing, and other tools.

In some embodiments, the processing tool 32 includes one or more load ports 321. The load ports 321 are configured to support and dock the article carriers 10 for facilitating the insertion of article carriers 10 into, and their subsequent removal from, a processing chamber 322 of the processing tool 32.

The stocker 33 is configured to automate the storage and retrieval of the article carrier 10. In some embodiments, the stocker 33 includes a main body 330, a number of storage shelves 331 and a number of load ports 332. The storage shelves 331 are positioned inside the main body 330 and configured to facilitate the storage of the article carriers 10 within the main body 330. The load port 332 is configured to support and dock the article carriers 10 for facilitating the insertion of article carriers 10 into, and their subsequent removal from, the main body 330 of the stocker 33. The load port 332 is positioned along the rail 311 of the transportation apparatus 31 so as to receive the article carriers 10 transferred from the vehicle of the transportation apparatus 31.

The maintenance station 34 is configured to perform maintenance process on the metrology tools 35, 36, 37 and 38. In some embodiments, the maintenance station 34 stores a number of new metrology tools 35, 36, 37 and 38 that are going to replace metrology tools 35, 36, 37 and 38 that are positioned on the vehicle 312. To perform the maintenance process, at least one of the metrology tools 35, 36, 37 and 38 positioned on the vehicle 312 is unloaded from the vehicle 312, and one or more new metrology tools are mounted on the vehicle 312. The maintenance process in the maintenance station 34 may be conducted automatically or manually.

Back to FIG. 1 again, the analysis system 50 evaluates conditions of the fabrication system 30 to detect abnormalities or faults, such as metrology tool failure or unexpected object located in front of the vehicle 312, by monitoring the data associated with the detection signals produced by the metrology tools 35-38. In one example, an abnormality is indicated when the data associated the detection signal varies (higher or lower) from a preset pattern, for example, by archival data stored in the archive database 70. Such abnormalities may indicate that there is a fault with the metrology tool. For example, damage to metrology tool may cause the reflected test signals to vary from the expected pattern. Alternatively, the abnormalities may indicate that there the vehicle 312 is getting close to an object located forward.

In some embodiments, the analysis system 50 implements statistical process control (SPC) to track and analyze the condition of the vehicle 312. For example, the analysis system 50 may implement SPC charts that document historical data of the vehicle 312 by charting SPC data associated with the transporting procedure over time. When the SPC data indicates that parameters have departed from a range of acceptable values (in other words, when the analysis system 50 detects a fault or abnormality), the analysis system 50 triggers a warning to the control system 60, so that any fault with the article carrier 10 may be identified and remedied.

The control system 60 can implement control actions in real time. In the depicted embodiments, the control system 60 implements control actions to control the operation status of the fabrication system 30. For example, the control system 60 controls the operation of the transportation apparatus 31 so as to move the vehicle 312 to a requested position, such as the test region TR1 shown in FIG. 2, for a test processing. In some other embodiments, the control system 60 implements control actions to actuate the transportation apparatus 31 to move the vehicle to the maintenance station 34 to undergo maintenance process.

In some other embodiments, the control system 60 implements control actions to modify process parameter performed by the processing tool 32. For example, the control system 60 modifies the predetermined process parameter (specifically, the parameters implemented by the processing tool 32 may include process time, flow rate of gas, chamber pressure, chamber temperature, wafer temperature, and other process parameters) for each wafer to ensure that each wafer located in the processing tool 32 exhibits the targeted characteristics.

The archive database 70 may include a number of storage devices to provide information storage. The information may include raw data obtained directly from the metrology tools 35-38. For example, information from the metrology tool 35 may be transferred to the archive database 70 and stored in the archive database 70 for archival purposes. Data from the metrology tools 35-38 may be stored in its original form (e.g., as it was obtained from the metrology tools 35-38) and it may be stored in its processed form (e.g., converted to a digital signal from an analog signal).

In the depicted embodiment, the archive database 70 stores data collected from the fabrication system 30, the analysis system 50, the control system 60, or a combination thereof. For example, the archive database 70 stores data associated with wafer characteristics of wafers processed by the fabrication system 30, data associated with parameters implemented by the fabrication system 30 to process such wafers, data associated with analysis of the wafer characteristics and/or parameters of the analysis system 50 and the control system 60, and other data associated with the fabrication facility 1. In one example, the fabrication system 30, the analysis system 50, the control system 60 may each have an associated database.

Figure 7A:
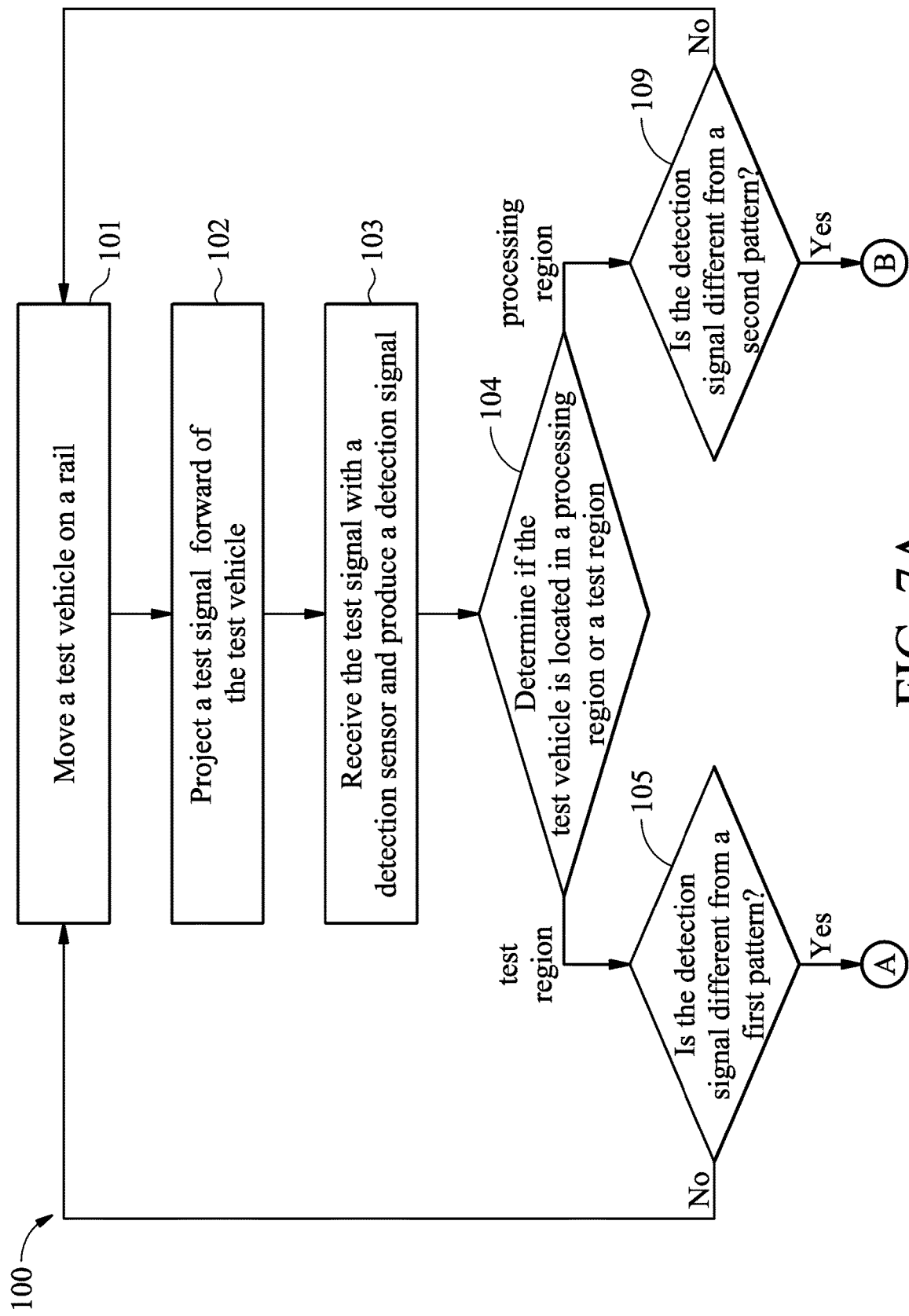
FIG. 7A shows a partial simplified flowchart of a method of enabling fault detection within the fabrication system, in accordance with some embodiments.
Figure 7B:
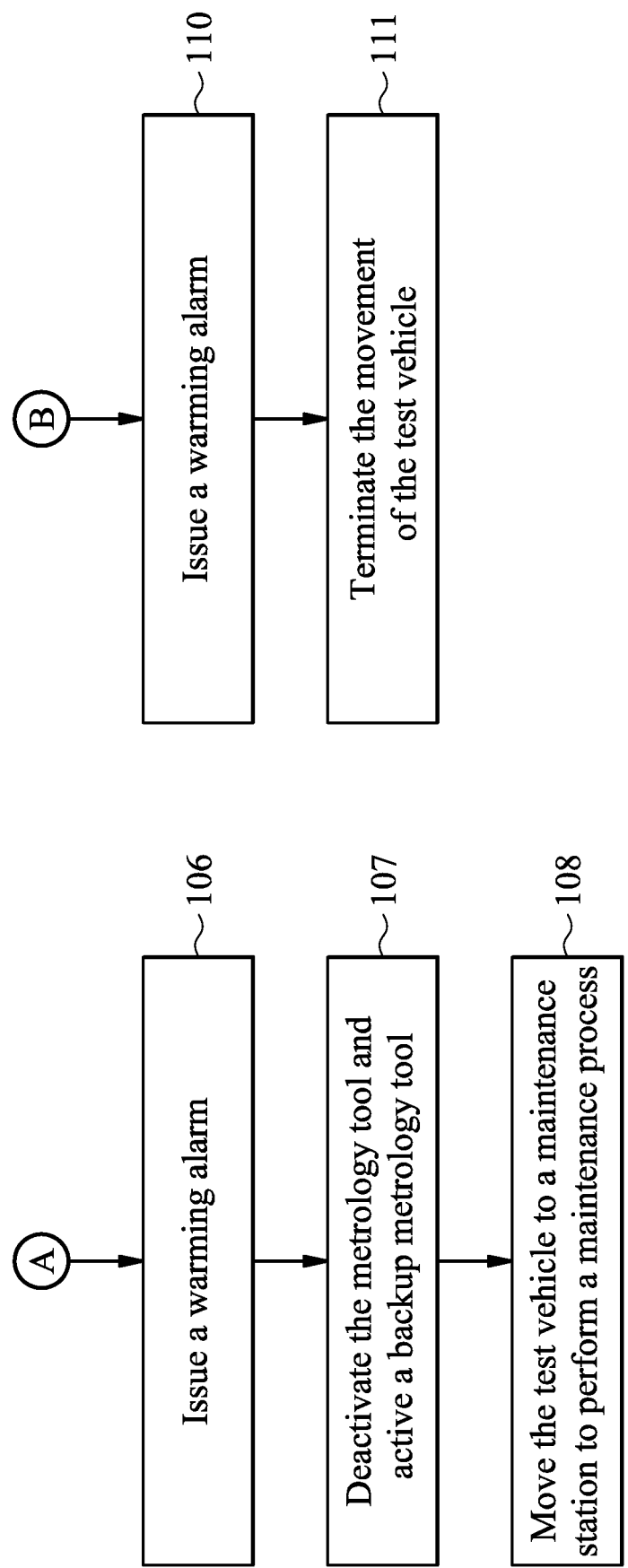
FIG. 7B shows a partial simplified flowchart of a method of enabling fault detection within the fabrication system, in accordance with some embodiments.

FIGS. 7A and 7B are a simplified flowchart of a method 100 of enabling fault detection within the fabrication system 30, in accordance with some embodiments. For illustration, the flow chart will be described along with the drawings shown in FIGS. 3, 8A, 8B and 9. Some of the described stages can be replaced or eliminated in different embodiments.

The method 100 includes operation 101, in which a vehicle 312 is controlled to move along the rail 311. In some embodiments, one of the vehicles 312 on the rail 311 without gripping an article carrier 10 is assigned by the control system 60 to check if the metrology tools 35-38 positioned thereon are working normally. The assigned vehicle 312 is moved to the test region TR1 of the rail 311 as shown in FIG. 3. Any vehicle 312 that has not been checked within a given time may be assigned. For purpose of description, in the following description, the vehicle 312 that is assigned to be checked is referred to as a test vehicle.

The method 100 also includes operation 102, in which test signals are projected forward (i.e. along a direction the vehicle 312 moves) of the test vehicle 312 with the metrology tools 35-38. In some embodiments, operation 101 and 102 are performed simultaneously. That is, the test signals are projected ahead of the vehicle 312 as long as the test vehicle 312 moves along the rail 311.

The method 100 further includes operation 103, in which at least a portion of the test signals are detected with the detection sensors 352, 362, 372 and 382, and the detection sensors 352, 362, 372 and 382 produce detection signals according to the detected test signals.

Figure 8A:
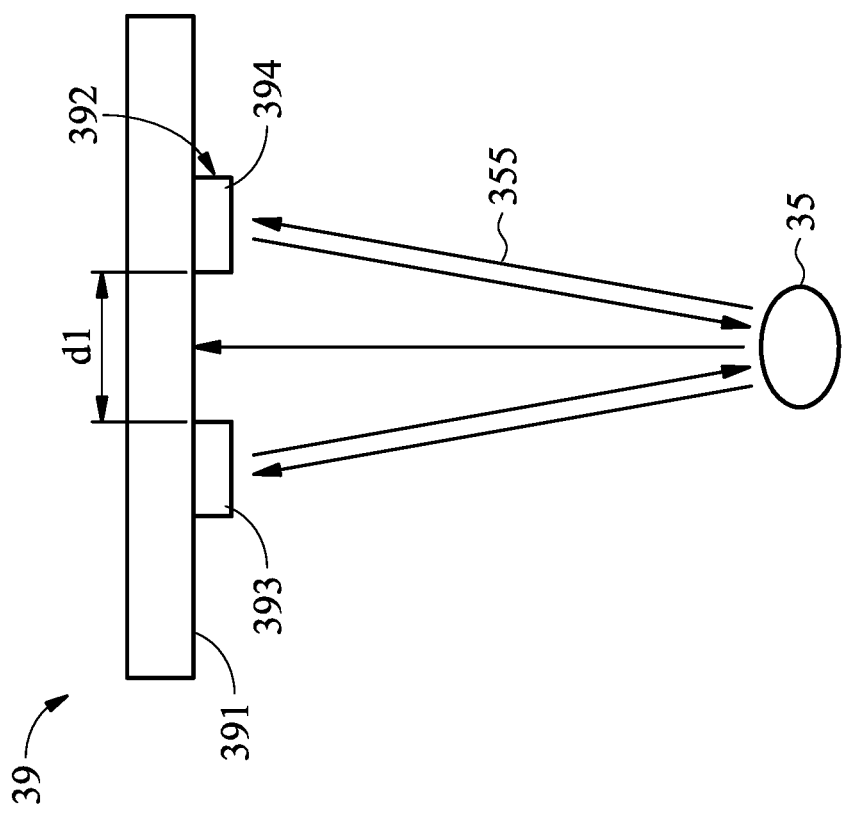
FIG. 8A shows transmission of a test signal from a metrology tool, in accordance with some embodiments.

FIG. 8A shows one exemplary embodiment of the transmission of the test signal from the metrology tool 35. In some embodiments, there are twelve laser beams (only three laser beams are shown in FIG. 8A) are projected over the reflection region 392 of the check board 39 from the metrology tool 35. Since the two sub-regions 393 and 394 are separated from each other by a distance dl, a portion of the laser beams (e.g., the laser beam indicated by the middle arrow) is absorbed and not reflected by the non-reflective region 391. On the other hand, a particular number of reflected laser beams, such as five, are expected to be reflected back from the two sub-regions 393 and 394 and received by the metrology tool 35.

Figure 8B:
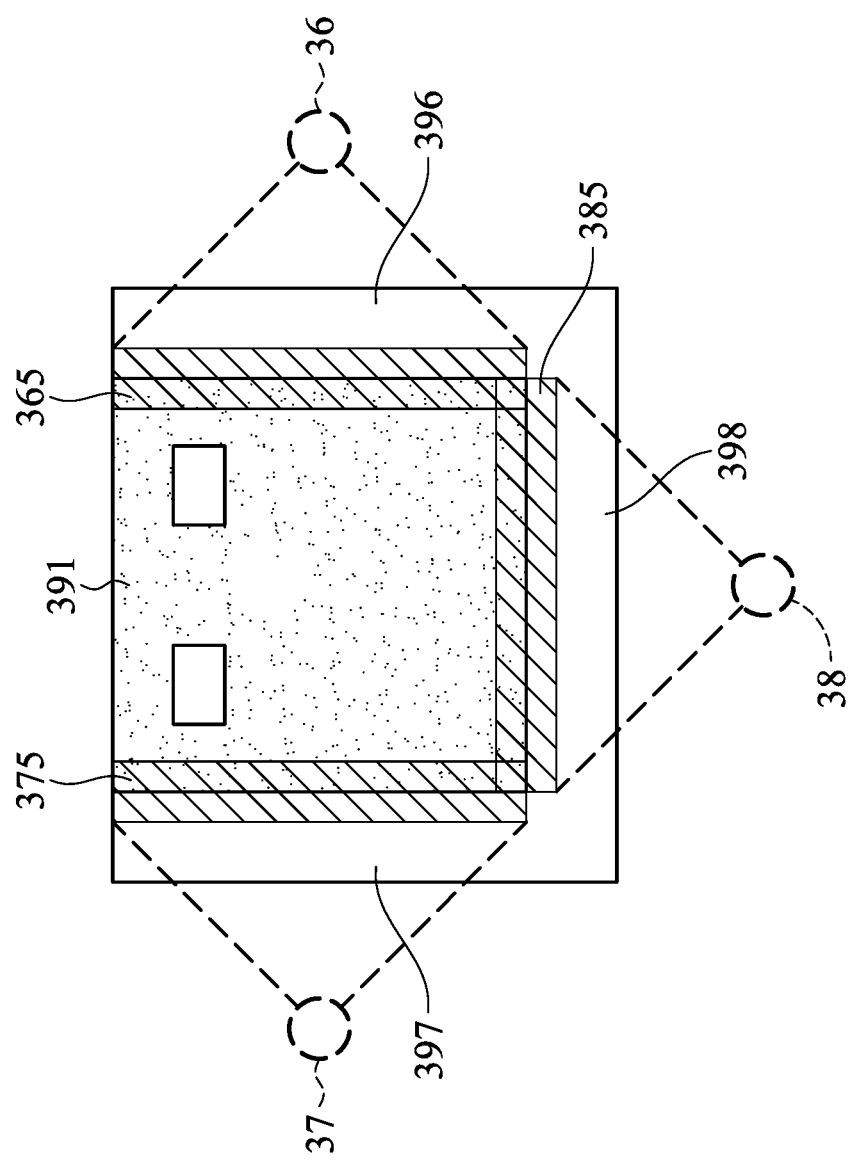
FIG. 8B shows transmissions of a number of test signals from different metrology tools, in accordance with some embodiments.

FIG. 8B shows one exemplary embodiment of the transmission of the test signals from the metrology tool 35. In some embodiments, there are three light beams being projected over the three sub-regions 396, 397 and 398 of the check board 39 from the metrology tools 36, 37 and 38. Since the three sub-regions 396, 397 and 398 are immediately connected to the non-reflective region 391, a portion of the light beams are absorbed and not reflected by the non-reflective region 391. On the other hand, a particular amount of light energy is expected to be reflected back from the check board 39 and received by the metrology tools 36, 37 and 38.

Referring to FIG. 7A, the method 100 further includes operation 104, in which the position of the test vehicle 312 is located. In some embodiments, the position of the test vehicle 312 is determined based on the control signal produced by the control system 60 which controls the operation of the transportation apparatus 31. In some other embodiments, the position of the test vehicle 312 is determined based on one or more positioning sensors positioned in a predetermined position in the FAB. The positioning sensors detect the absence of the test vehicle 312 and transmit the detection result to the control system 60, and the control system 60 calculates the position of the detection result. However, other methods can be used to determine the position of the test vehicle 312 and should not be limited to the above embodiments.

In cases where the test vehicle 312 is located in the test region TR1 as shown in FIG. 3, the method proceeds to operation 105. In operation 105, the detection signals from the metrology tools 35-38 are analyzed to determine if the detection signals are different from a first pattern. Specifically, the test signals from the metrology tools 35-38 are projected over the check board 39 and reflected back from the check board 39.

Since the configuration of the check board 39 is a known parameter, the test signals reflected by the check board 39 show the first pattern when the metrology tools 35-38 are functioning normally. If any one of the metrology tools 35-38 fails, the detection signal produced by the corresponding metrology tools 35-38 is different from the first pattern. In one exemplary embodiment, the first pattern may include the number of laser beams received by the metrology tool 35, and/or the amount of light energy received by the metrology tools 36, 37 and 38.

After the comparison, if an analysis of the detection signals shows that the detection signals are the same as the first pattern, the method repeats operation 101-104. However, if an analysis of the detection signals shows that the detection signals have deviated from the first pattern, the method continues with operations 106-108, as shown in FIG. 7B.

In operation 106, a warning alarm is issued. In operation 107, the one or more metrology tools 35, 36, 37 and 38 that are detected to be in error are deactivated and the corresponding backup metrology tool is activated. For example, in cases where the metrology tool 35 is detected as having an abnormality, the analysis system 50 issues the warning alarm. Afterwards, in response to the warning alarm, the control system 60 turns off the operation of the metrology tool 35 and turns on the backup metrology tool 35' to continuously monitor conditions in front of the test vehicle 312. Therefore, collision of the test vehicle 312 with other object can be avoided because the condition ahead of the test vehicle 312 is monitored by the backup metrology tool 35' rather than the unstable metrology tool 35. In some embodiments, operation 107 is omitted if there is no backup metrology tool mounted on the test vehicle.

In operation 108, the test vehicle 312 is moved to a maintenance station 34 to undergo maintenance. In some embodiments, the control system 60 moves the test vehicle 312 to the maintenance station 34 for maintenance in response to the warning alarm. When the test vehicle 312 undergoes maintenance, any suitable process may be performed on the test vehicle 312 so as to make the test vehicle 312 suitable for use again. For example, in the maintenance process, the metrology tool that is marked with failure is replaced with a new metrology tool. As a result, the issues with the test vehicle 312 are fixed properly. The test vehicle 312 may be moved to the maintenance station 34 after a number of scheduled events are finished rather than immediately after the warning alarm is issued.

Figure 9:
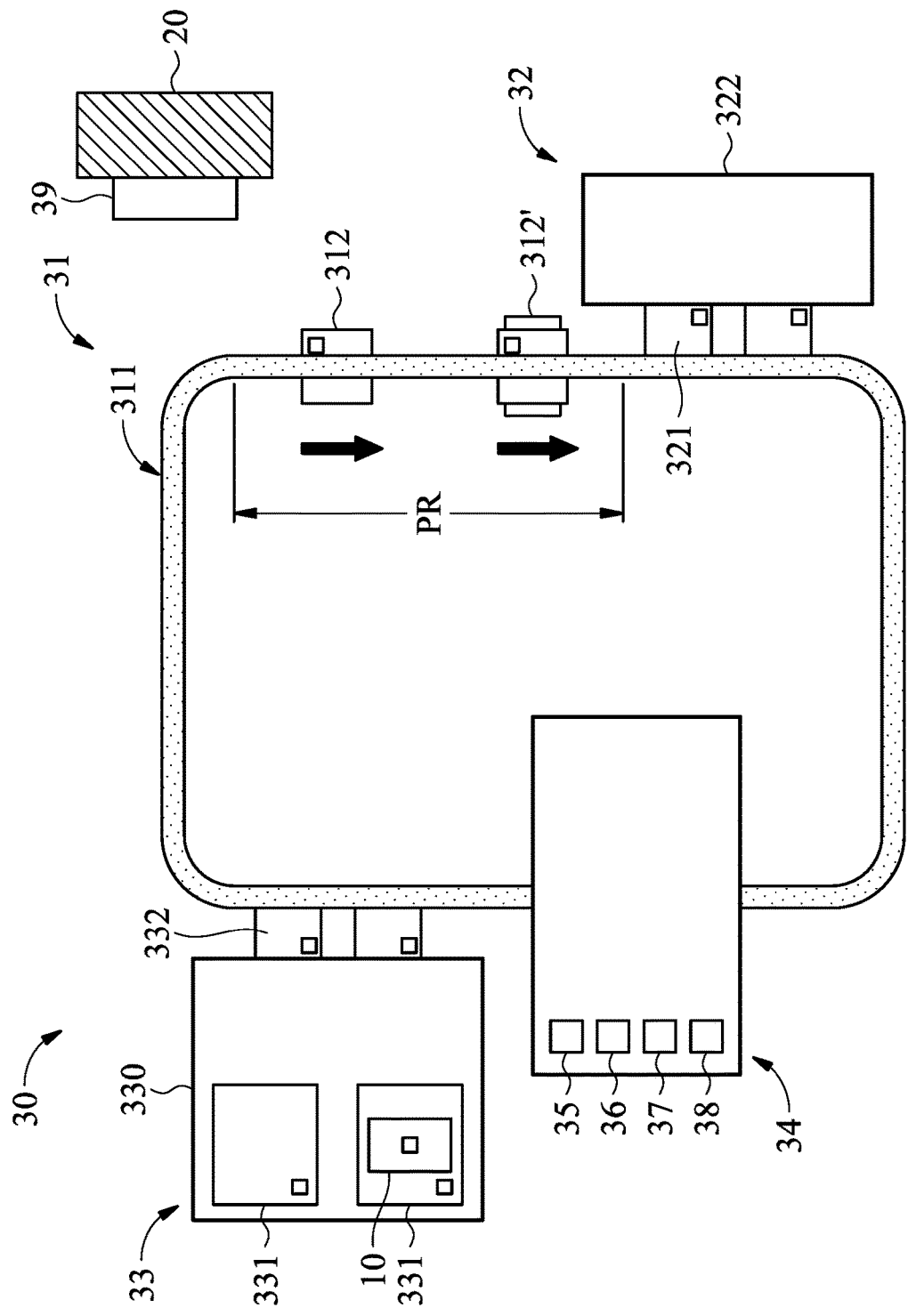
FIG. 9 shows a schematic view of partial elements of a fabrication system as an object is detected in front of the test vehicle in a processing region, in accordance with some embodiments.

Referring to FIG. 7A, in operation 104, when the test vehicle 312 is located in a processing region PR (a region that is outside of the test region TR1, as shown in FIG. 9), the method proceeds to operation 109. In operation 109, the detection signals from the metrology tools 35-38 are analyzed to determine whether the detection signals are different from a second pattern.

The second pattern may include detection signals from the metrology tools 35-38 when there is no object located forward the test vehicle 312 within a predetermined distance, such 1.5 meters. The second pattern may be historic data retrieved from the archive database 70 in cases where the detection signals in different locations in the processing region is recorded. An analysis of the detection signals is performed by comparing the real-time detected result with the historical data in the same location. Alternatively, the second pattern is a default fixed value.

After the comparison, if an analysis of the detection signals shows that the detection signals are the same as the second pattern, the method repeats operation 101-104. However, if an analysis of the detection signals shows that the detection signals have deviated from the second pattern, the method continues with operations 110 and 111, as shown in FIG. 7B.

In some embodiments, when the analysis system 50 indicates that the detection signal has departed from the second pattern (in other words, when the analysis system 50 detects a fault or abnormality), the analysis system 50 triggers a warning alarm in operation 110. In some embodiments, out-of-specification data exhibits behavior that indicates a fault (or abnormality) in the fabrication system 30.

In the present example, statistically analyzed parameter data is out of specification when it exhibits behavior associated with an object (such as another vehicle 312', as shown in FIG. 9) located in front of the test vehicle 312. In order to protect the test vehicle 312 from damage due to collision with another vehicle 312', the method continues operation 111, in which the movement of the test vehicle 312 is terminated by the control system 60. In addition, the analysis system 50 notifies an operator and indicates the location where the fault has occurred so that any issues with the test vehicle 312 may be identified and remedied.

Figure 10:
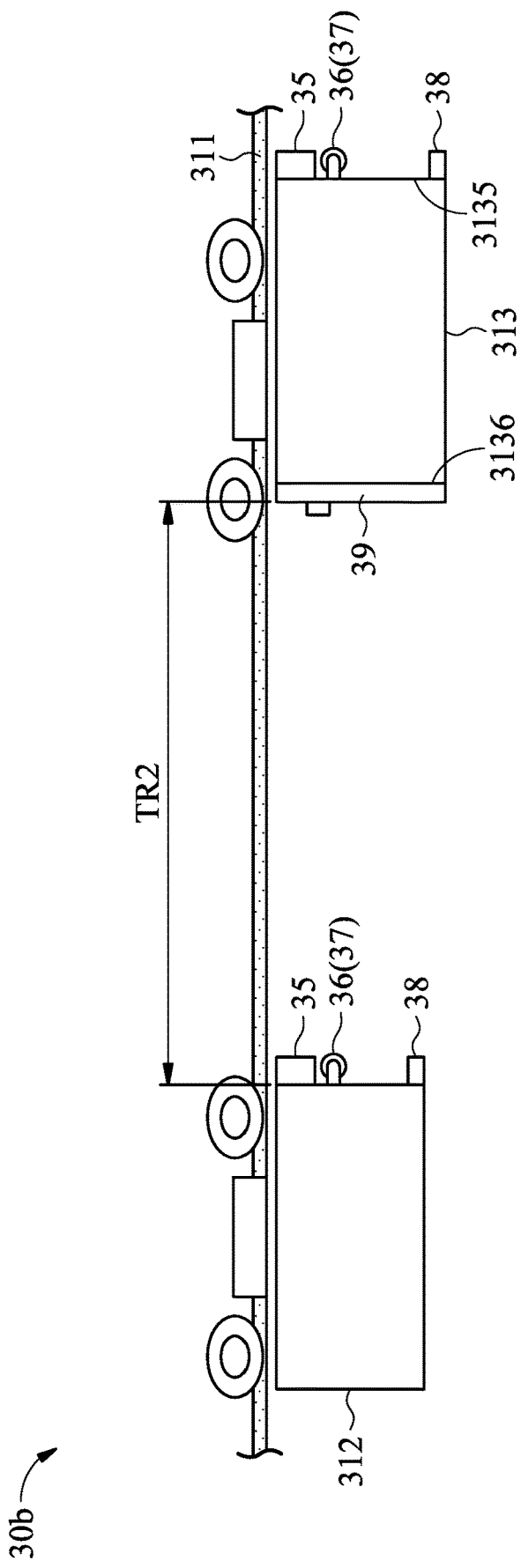
FIG. 10 shows a schematic view of partial elements of a fabrication system, in accordance with some embodiments.

FIG. 10 shows a schematic view of partial elements of a fabrication system 30b, in accordance with some embodiments. Differences between the fabrication system 30 and the fabrication system 30b include the fabrication system 30b further including one patrol vehicle 313 moving along the rail 311, and the test board 39 being connected to the patrol vehicle 313. In some embodiments, the patrol vehicle 313 has a similar or identical configuration as the vehicle 312, and the test board 39 is connected to the rear surface 3136 of the patrol vehicle 313 which is opposite the front surface 3135 where the metrology tools 35-38 are positioned.

A test region TR2 is located within a predetermined distance, such as 1.5 meters, from the patrol vehicle 313. In operation 104 of method 100 shown in FIG. 7A, when the test vehicle 312 is located in the test region TR2 and the detection signals deviate from the first pattern, the method 100 continues with operations 105-108.

Conversely, when the test vehicle 312 is located in the test region TR2 and detection signals are the same as the first pattern (which means the metrology tools on the test vehicle 312 are functioning normally), the method repeats operation 101-104, and the patrol vehicle 313 is moved away from the front region of the test vehicle 312 and may be moved to another vehicle (not shown) which is going to be checked. In some embodiments, when the test vehicle 312 is moved into the test region TR2, both the test vehicle 312 and the patrol vehicle 313 move at the same speed, so that the patrol vehicle 313 is kept inside the test region TR2.

With the patrol vehicle 313, the test vehicle 312 can be checked without having to be moved to a designated region, such as the test region TR1 shown in FIG. 3. As a result, the process for checking the condition of the vehicle 312 can be performed with greater efficiency.

Figure 11:
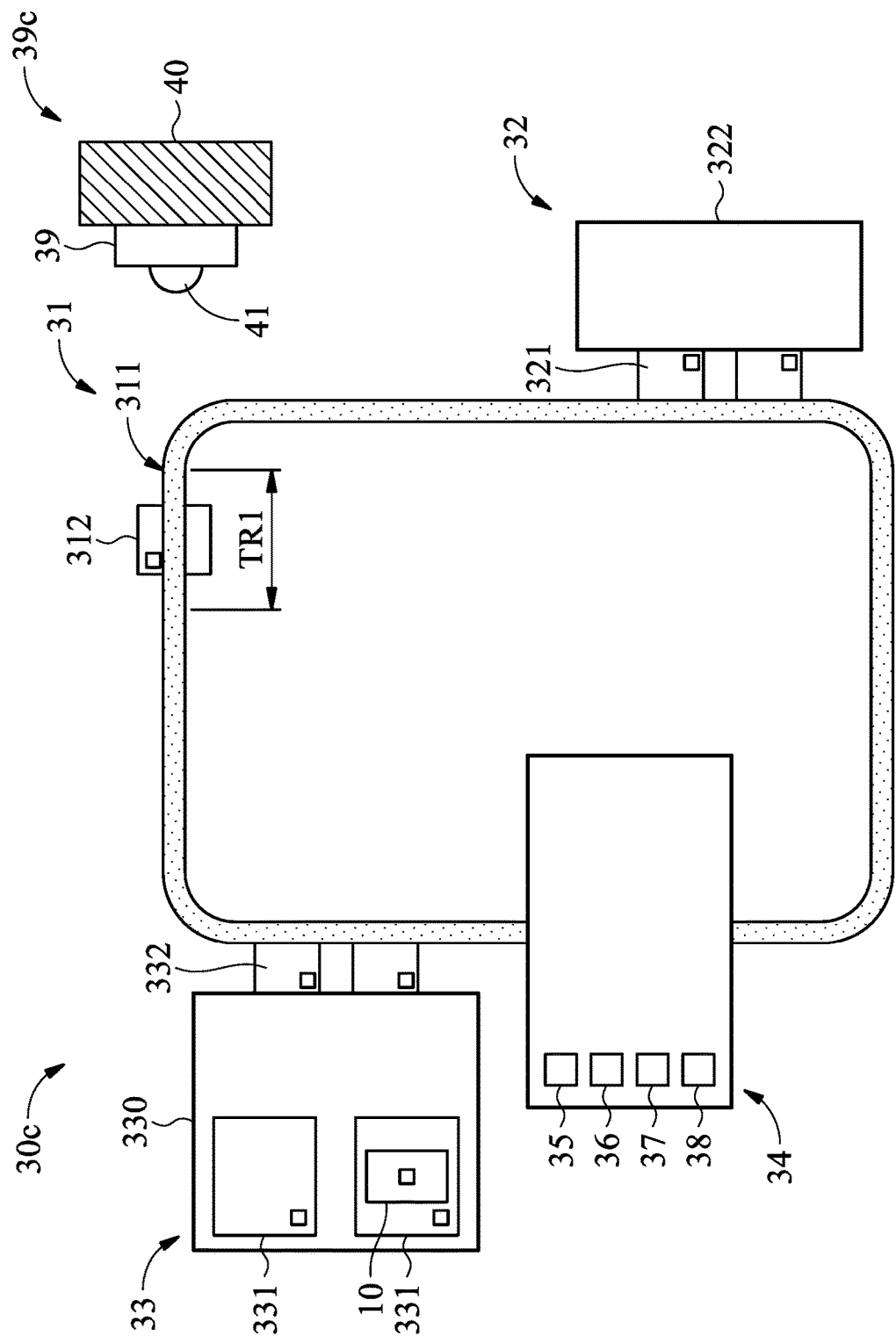
FIG. 11 shows a schematic view of a fabrication system, in accordance with some embodiments.

FIG. 11 shows a schematic view of partial elements of a fabrication system 30b, in accordance with some embodiments. Differences between the fabrication system 30 and the fabrication system 30c include the fabrication system 30c further including a detection sensor 41 mounted on the check board 39. In some embodiments, the detection sensor 41 is configured to detect the test signal 355, projected over the check board 39 (FIG. 4) and produce a detection signal accordingly. However, it should be appreciated that many variations and modifications can be made to embodiments of the disclosure. In some other embodiments, there is more than one detection sensor 41 positioned on the check board 39 to detect the test signals projected over the check board 39 from different metrology tools, such as metrology tools 36-38.

In some embodiments, the detection signal from the detection sensor 41 and the detection signal from the metrology tool 35 are analyzed simultaneously so that it can be determined whether the transducer 351 or the detection sensor 352 has failed. For example, when the analysis of the detection signals from the detection sensor 41 and the metrology tool 35 is not accepted, the analysis system 50 may determine that the transmitter 351 has failed because the test signal projected over the check board 39 has deviated from a preset pattern.

Moreover, when the analysis of the detection signal from the detection sensor 41 is accepted and the analysis of the detection signal from the metrology tool 35 is not accepted, the analysis system 50 may determine that the detection sensor 352 has failed because the test signal projected over the check board 39 has an expected pattern. With an early analysis of the condition of the metrology tool 35, the efficiency of the maintenance process can be improved.

Embodiments of method and device for fault detection in a fabrication facility are provided. Data associated with the metrology tool positioned on the vehicle are collected and analyzed to determine whether an abnormal condition of the metrology tool is generated. When an abnormal situation with the metrology tools occurs and the test vehicle is located within the test region, the control system will arrange a maintenance process at a future time to fix the issue with the metrology tool. Therefore, a false alarm caused by an abnormality in the metrology tool can be mitigated or avoided, and the labor and cost needed to remedy the false alarm can be reduced.

In accordance with some embodiments, a fault detection method in a semiconductor fabricating factory is provided. The method includes delivering a test vehicle along a rail to a test region. The method further includes projecting a test signal from a transducer that is positioned on the test vehicle over a check board when the test vehicle is located within the test region. The check board and the test vehicle are arranged along an axis that is parallel to the rail. The method also includes performing an analysis of the test signal projected over the check board. In addition, the method includes issuing a warning alarm when an abnormality is detected based on the analysis result.

In accordance with some embodiments, a fault detection method in a semiconductor fabricating factory is provided. The method includes moving a test vehicle passing through a processing region and a test region. The method further includes projecting a test signal forward and receiving the test signal reflected from an object that is located in front of the test vehicle. The method also includes performing an analysis of the reflected test signal and issuing a warning alarm when an abnormality is detected based on the analysis result. When the warning alarm is issued while the test vehicle is located within a test region, the movement of the test vehicle continues. When the warning alarm is issued while the test vehicle is located outside of the test region the movement of the test vehicle is terminated.

In accordance with some embodiments, a fabrication facility is provided. The fabrication facility includes a rail and a test vehicle movably along the rail. The fabrication facility further includes a transducer positioned on the test vehicle and configured to transmit a test signal ahead of the test vehicle. The fabrication facility also includes a check board positioned in front of the test vehicle. The check board includes a non-reflective region facing the transducer made of light-absorbing material. The check board further includes a reflection region positioned adjacent to the non-reflective region and made of light-reflective material. In addition, the fabrication facility includes a detection sensor placed on the test vehicle. The detection sensor is configured to receive the test signal that is reflected from the reflection pad.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A fault detection method in a semiconductor fabricating factory, comprising:
   delivering a test vehicle along a rail;
   delivering a patrol vehicle in front of the test vehicle;
   projecting a test signal from a transducer that is positioned on the test vehicle over a check board when the test vehicle is located within a test region, wherein the check board and the test vehicle are arranged along an axis that is parallel to the rail, wherein the check board is positioned on the patrol vehicle, and the test region is within a predetermined distance from the patrol vehicle;
   performing an analysis of the test signal projected over the check board; and
   issuing a warning alarm when an abnormality is detected based on the analysis result.

2. The fault detection method in a semiconductor fabricating factory as claimed in claim 1, wherein the analysis of the test signal comprises:
   receiving the test signal reflected from the check board by using a detection sensor that is positioned on the test vehicle, wherein the analysis of the test signal is performed based on a detection signal produced by the detection sensor.

3. The fault detection method in a semiconductor fabricating factory as claimed in claim 1, wherein the analysis of the test signal comprises:
   receiving the test signal with a detection sensor that is positioned on the check board, wherein the analysis of the test signal is performed based on a detection signal produced by the detection sensor.

4. The fault detection method in a semiconductor fabricating factory as claimed in claim 1, wherein the rail provides a straight path and a curved path.

5. The fault detection method in a semiconductor fabricating factory as claimed in claim 1, further comprising dispatching the test vehicle to a maintenance station for a maintenance process when the warning alarm is issued.

6. The fault detection method in a semiconductor fabricating factory as claimed in claim 1, further comprising deactivating the transducer and activating a backup metrology tool to project another test signal over the check board when the warning alarm is issued.

7. The fault detection method in a semiconductor fabricating factory as claimed in claim 1, wherein the transducer comprises a laser transmitter for projecting the test signal comprising laser, or the transducer comprises a light emitting diode for projecting the test signal comprising light.

8. The fault detection method in a semiconductor fabricating factory as claimed in claim 1, wherein the abnormality indicates that data associated with the test signal is different from a preset pattern.

9. A fault detection method in a semiconductor fabricating factory, comprising:
   moving a test vehicle along a rail;
   delivering a patrol vehicle in front of the test vehicle;
   projecting a test signal ahead of the test vehicle and receiving the test signal reflected by an object that is located in front of the test vehicle;

performing an analysis of the reflected test signal and issuing a warning alarm when an abnormality is detected based on the analysis result;

continuing the movement of the test vehicle when the warning alarm is issued while the test vehicle is located in a test region of the rail, wherein the test region is within a predetermined distance from the patrol vehicle; and terminating the movement of the test vehicle when the warning alarm is issued while the test vehicle is located outside of the test region.

10. The fault detection method in a semiconductor fabricating factory as claimed in claim 9, wherein the rail comprises a straight path and a curved path.

11. The fault detection method in a semiconductor fabricating factory as claimed in claim 9, wherein the object comprises a check board positioned on the patrol vehicle, and the analysis of the test signal comprises:

receiving the test signal reflected back from the check board by using a detection sensor that is positioned on the test vehicle, wherein the analysis of the test signal is performed based on a detection signal produced by the detection sensor.

12. The fault detection method in a semiconductor fabricating factory as claimed in claim 9, further comprising dispatching the test vehicle to a maintenance station for a maintenance process when the warning alarm is issued while the test vehicle is located within the test region.

13. The fault detection method in a semiconductor fabricating factory as claimed in claim 9, wherein the test signal is transmitted with a transducer positioned on the test vehicle;

wherein the transducer comprises a laser transmitter for projecting the test signal comprising laser, or the transducer comprises a light emitting diode for projecting the test signal comprising light.

14. The fault detection method in a semiconductor fabricating factory as claimed in claim 9, wherein the abnormality indicates that data associated with the test signal is different from a preset pattern.

15. A fabrication facility, comprising:
a rail;
a test vehicle movably along the rail;
a patrol vehicle movably in front of the test vehicle;
a check board positioned on the patrol vehicle and comprising:
a non-reflective region made of light-absorbing material; and
a reflection region positioned adjacent to the non-reflective region and made of light-reflective material; and
a metrology tool positioned on the test vehicle and configured to transmit a test signal to the check board and to detect the test signal that is reflected back from the reflection region.

16. The fabrication facility as claimed in claim 15, wherein the reflection region is surrounded by the non-reflection region, or the reflection region connects an outer side of the reflection region to an outer edge of the check board.

17. The fabrication facility as claimed in claim 15, further comprising:
a backup metrology tool positioned on the test vehicle;
an analysis system configured to analyze data associated with the reflected test signal and issue a warning alarm when an abnormality is detected; and
a control system configured to deactivate the metrology tool and activate the backup metrology tool, when the warning alarm is issued.

18. The fabrication facility as claimed in claim 15, further comprising:
an analysis system configured to analyze data associated with the reflected test signal and issue a warning alarm when an abnormality is detected; and
a control system configured to move the test vehicle to a maintenance station to replace the metrology tool with another new metrology tool when the warning alarm is issued.

19. The fault detection method in a semiconductor fabricating factory as claimed in claim 1, wherein when the test vehicle is moved into the test region, both the test vehicle and the patrol vehicle move at the same speed.

20. The fault detection method in a semiconductor fabricating factory as claimed in claim 9, further comprising delivering the patrol vehicle away from the front region of the test vehicle so that the test vehicle is located outside of the test region when an abnormality is not detected based on the analysis result.

* * * * *